United States Patent
Huang

(10) Patent No.: US 7,888,172 B2
(45) Date of Patent: Feb. 15, 2011

(54) CHIP STACKED STRUCTURE AND THE FORMING METHOD

(75) Inventor: Cheng-Tang Huang, Hsinchu (TW)

(73) Assignees: Chipmos Technologies Inc, Hsinchu (TW); Chipmos Technologies (Bermuda) Ltd, Hamilton (BM)

( * ) Notice: Subject to any disclaimer, the term of this patent is extended or adjusted under 35 U.S.C. 154(b) by 0 days.

(21) Appl. No.: 12/330,790

(22) Filed: Dec. 9, 2008

(65) Prior Publication Data

US 2009/0302448 A1 Dec. 10, 2009

(30) Foreign Application Priority Data

Jun. 5, 2008 (TW) ............... 97120849 A

(51) Int. Cl.
*H01L 21/00* (2006.01)
*H01L 21/469* (2006.01)

(52) U.S. Cl. .................. 438/107; 438/110; 438/114; 438/455; 438/456; 438/458; 438/759; 438/977

(58) Field of Classification Search .................. None
See application file for complete search history.

(56) References Cited

U.S. PATENT DOCUMENTS

| | | | | |
|---|---|---|---|---|
| 5,841,193 A * | 11/1998 | Eichelberger | ............... | 257/723 |
| 6,235,554 B1 * | 5/2001 | Akram et al. | ............... | 438/109 |
| 6,673,698 B1 * | 1/2004 | Lin et al. | ............... | 438/459 |
| 6,746,898 B2 * | 6/2004 | Lin et al. | ............... | 438/113 |
| 6,825,553 B2 * | 11/2004 | Chua et al. | ............... | 257/691 |
| 6,946,325 B2 * | 9/2005 | Yean et al. | ............... | 438/112 |
| 6,960,826 B2 * | 11/2005 | Ho et al. | ............... | 257/723 |
| 6,964,881 B2 * | 11/2005 | Chua et al. | ............... | 438/108 |
| 7,145,228 B2 * | 12/2006 | Yean et al. | ............... | 257/698 |
| 7,196,408 B2 * | 3/2007 | Yang et al. | ............... | 257/686 |
| 7,208,344 B2 * | 4/2007 | Ho | ............... | 438/107 |
| 7,271,033 B2 * | 9/2007 | Lin et al. | ............... | 438/113 |
| 7,297,614 B2 * | 11/2007 | Lee et al. | ............... | 438/459 |
| 7,321,164 B2 * | 1/2008 | Hsu | ............... | 257/686 |
| 7,485,562 B2 * | 2/2009 | Chua et al. | ............... | 438/613 |
| 7,557,437 B2 * | 7/2009 | Yang et al. | ............... | 257/685 |
| 7,754,531 B2 * | 7/2010 | Tay et al. | ............... | 438/112 |
| 2001/0010627 A1 * | 8/2001 | Akagawa | ............... | 361/761 |
| 2003/0122243 A1 * | 7/2003 | Lee et al. | ............... | 257/700 |
| 2005/0073029 A1 * | 4/2005 | Chua et al. | ............... | 257/620 |
| 2009/0302448 A1 * | 12/2009 | Huang | ............... | 257/686 |
| 2009/0302465 A1 * | 12/2009 | Huang | ............... | 257/737 |

\* cited by examiner

*Primary Examiner*—David E. Graybill
(74) *Attorney, Agent, or Firm*—Ming Chow; Sinorica, LLC

(57) ABSTRACT

A chip package structure is provided, includes a chip that having a plurality of pads and an adhesive layer on the back side; an encapsulated structure is covered around the four sides of the chip to expose the pads, and the through holes is formed within the encapsulated structure; a patterned first protective layer is formed on the portion surface of encapsulated structure, the portion of active surface of the chips, and the pads of the chip and the through holes are to be exposed; a metal layer is formed on the portion surface of the patterned first protective layer and formed to electrically connect the pads and to fill with the through holes; the patterned second protective layer is formed on the patterned first protective layer and the portion of metal layer, and the portion surface of metal layer is to be exposed; a patterned UBM layer is formed on the exposed surface of the metal layer and the portion surface of the patterned second protective layer; and the conductive elements is formed on the patterned UBM layer and electrically connect to the metal layer.

6 Claims, 11 Drawing Sheets

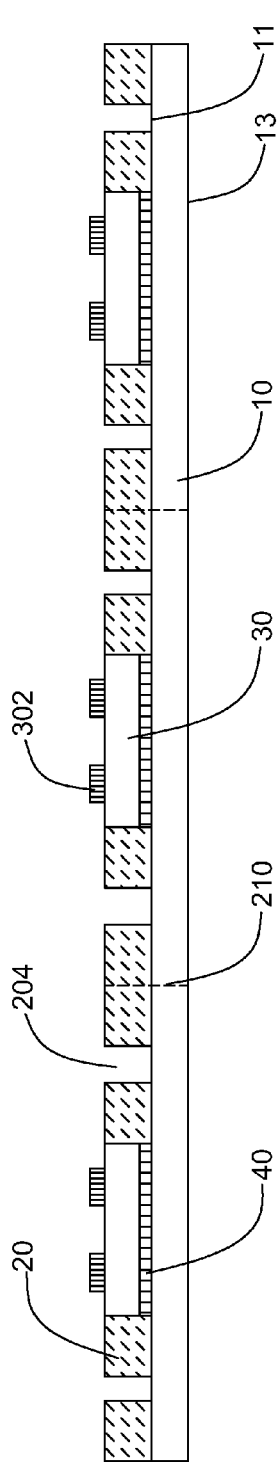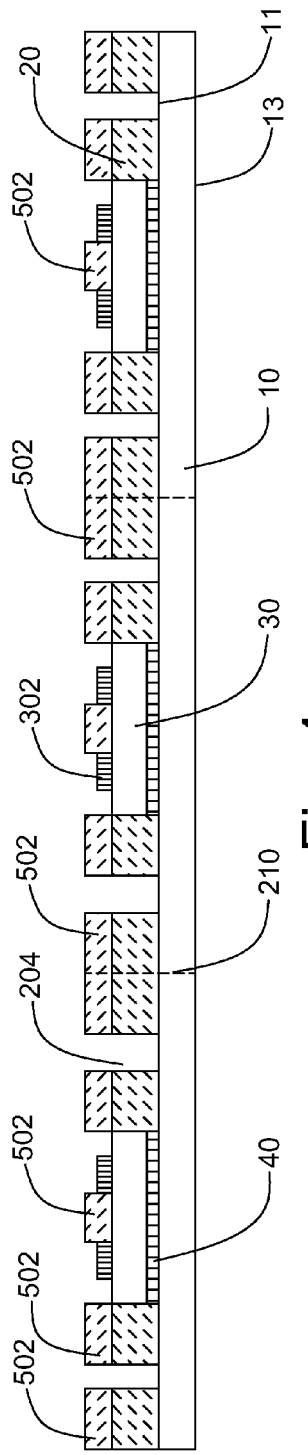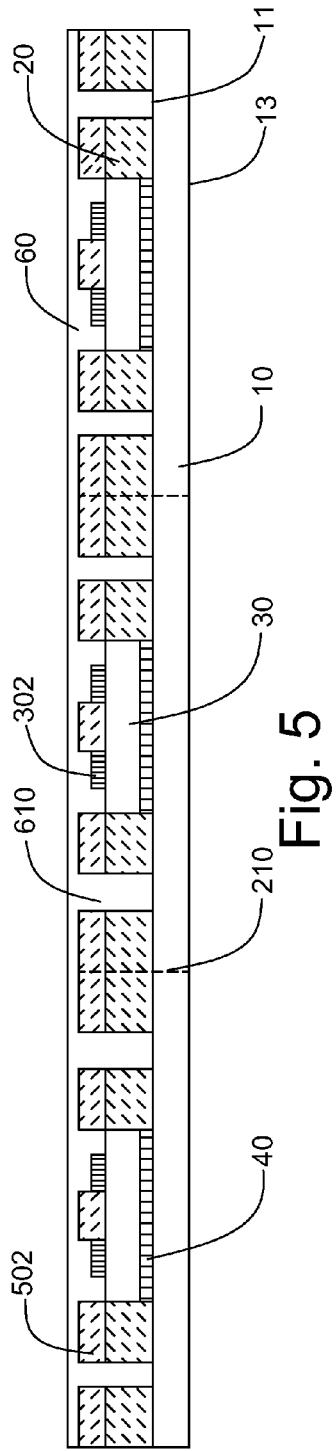

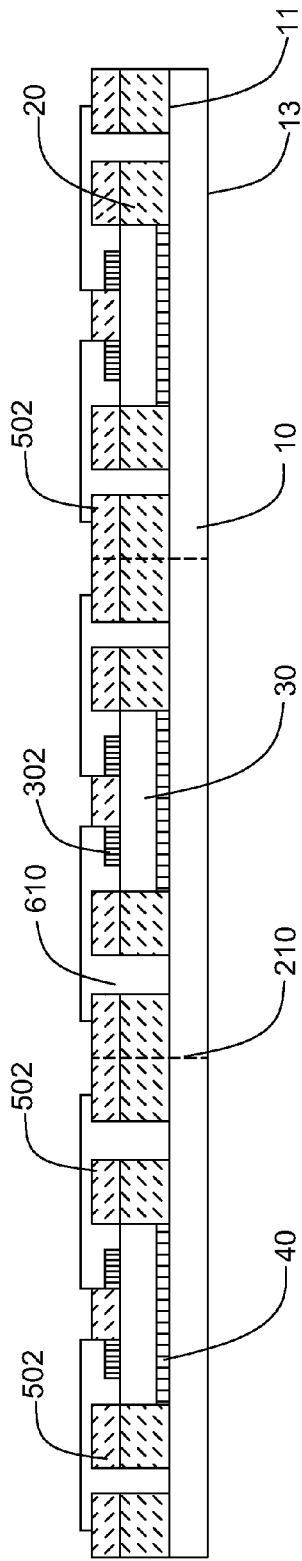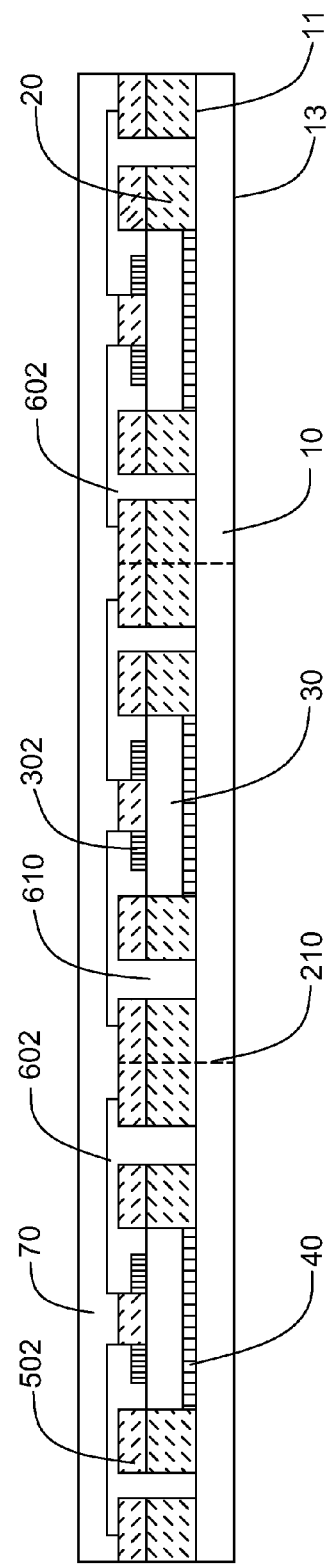

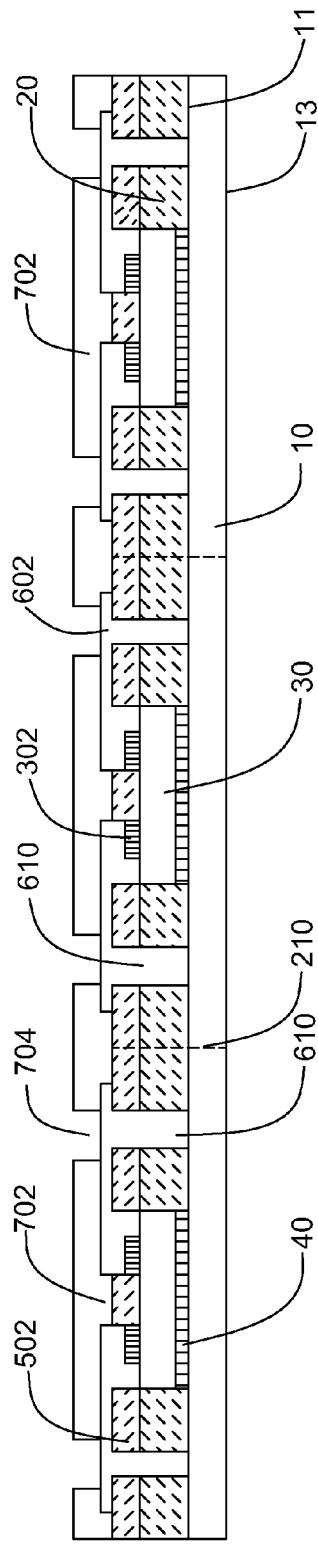
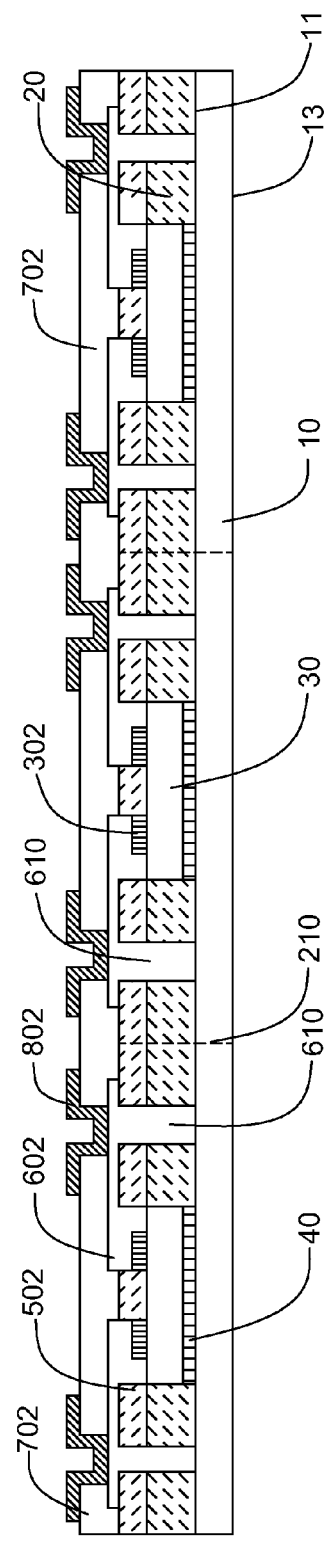
Fig. 8
Fig. 9

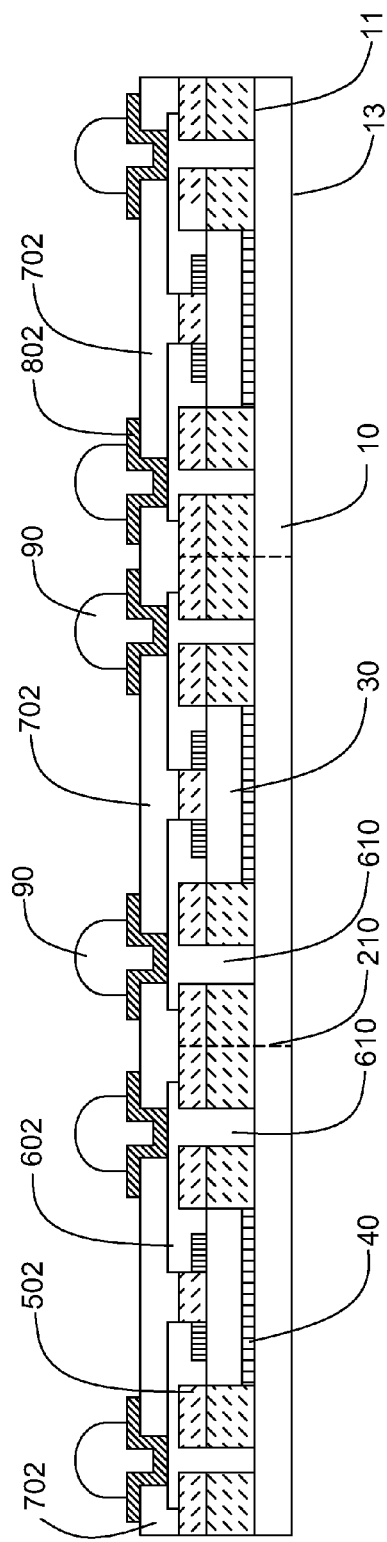
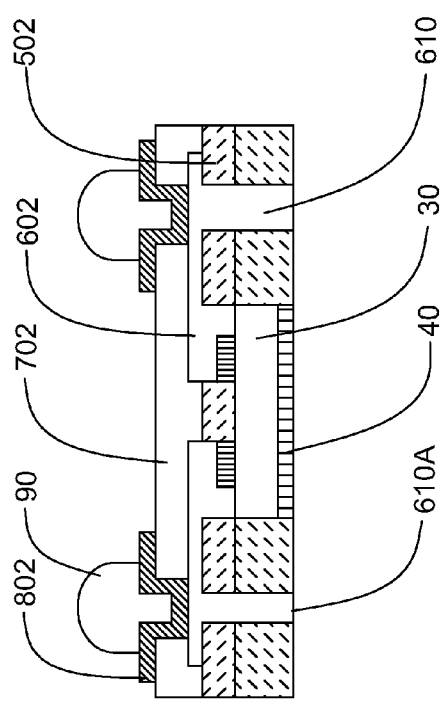
Fig. 10
Fig. 11

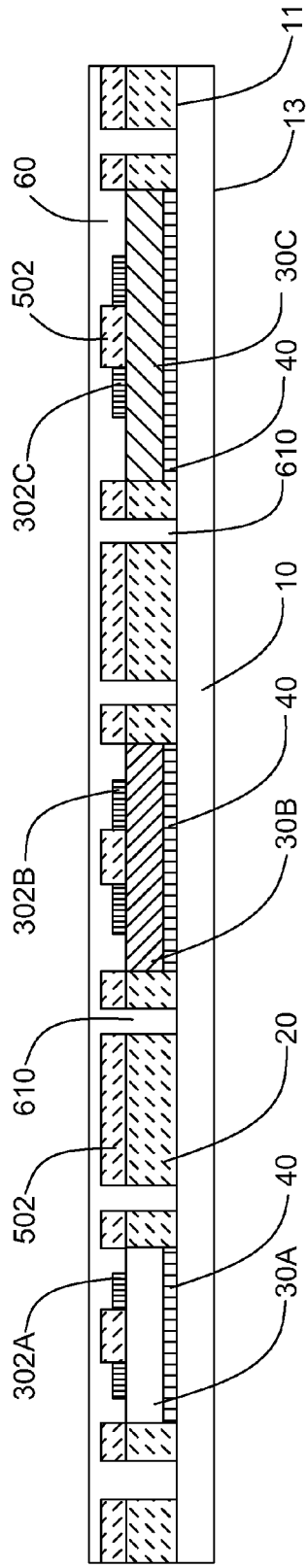
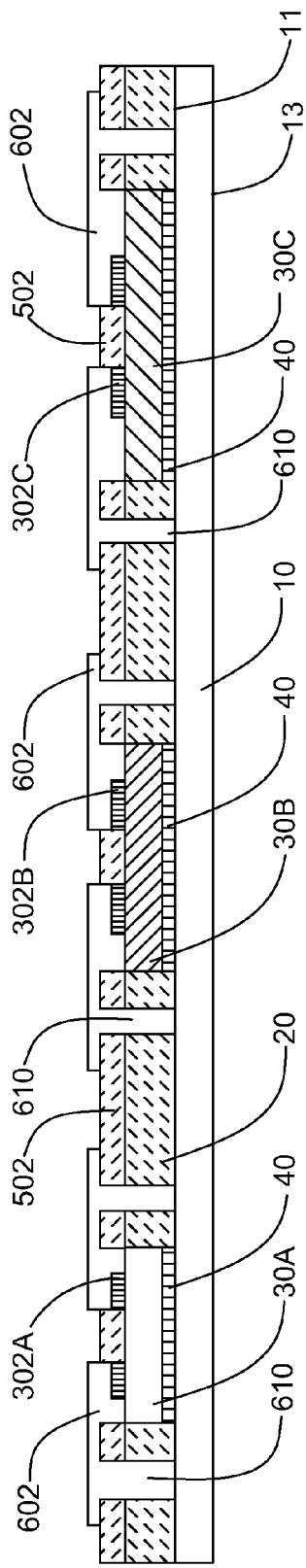

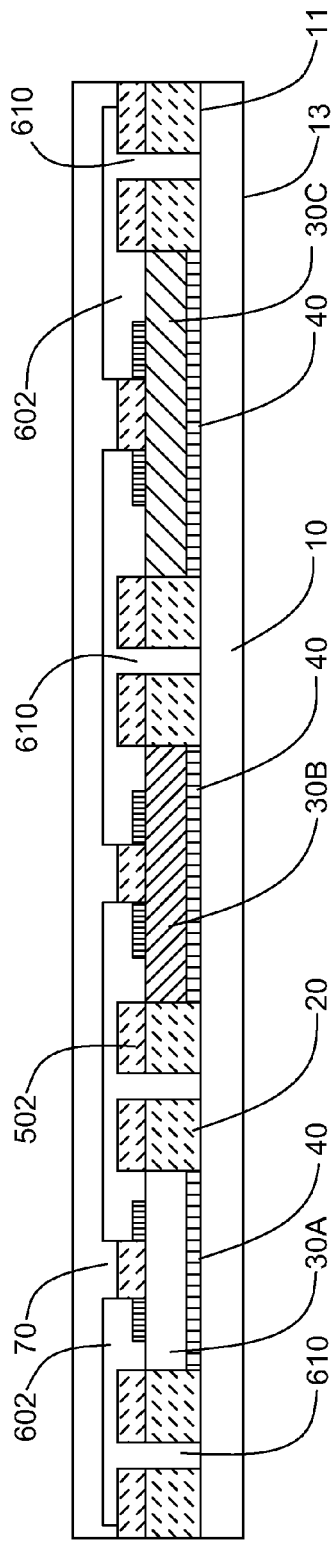
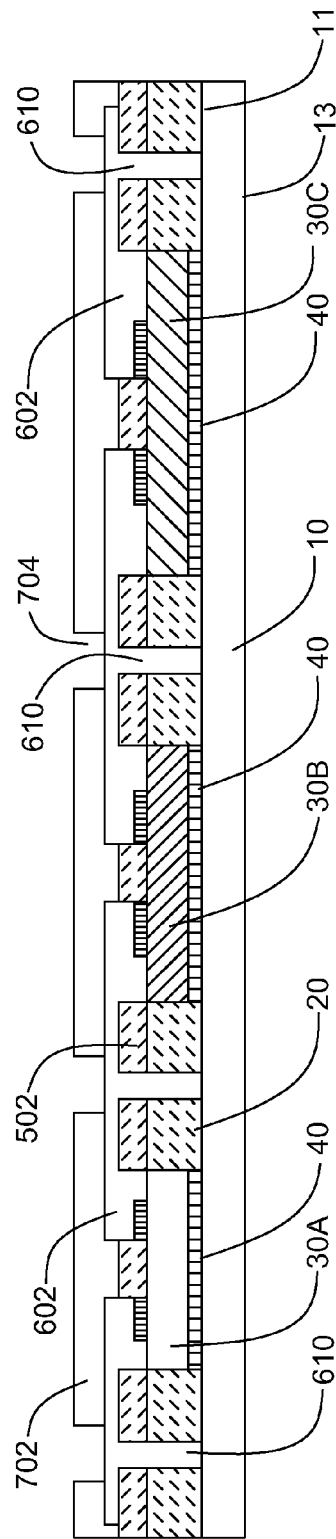
Fig. 18
Fig. 19

CHIP STACKED STRUCTURE AND THE FORMING METHOD

BACKGROUND OF THE INVENTION

1. Field of the Invention

The present invention is relates to a package structure and forming method which is applied for semiconductor manufacture, and more particularly is related to a chip package structure and a package method.

2. Description of the Prior Art

The semiconductor technology is well developed and grown up very fast. Because the microlized semiconductor dice are required to include more functions, the semiconductor dice are necessary to have more input/output (I/O) pads. The density of the metal pins is higher day after day. Therefore, the previous lead package technology is not compatible for dice with high density of metal pins. A Ball Grid Array (BGA) package method is used for dices with high density of metal pins. The BGA package method is not only suitable for using in dices with high density of metal pins, but also the solder balls is not easy to be damaged and out of shape.

Because the 3C products, such as cell phone, personal digital assistant (PDA), or MP3 player, are more and more popular in the market, there are more and more complicated chips installed in a very tiny space. In order to solve the microlized problems, a wafer lever package (WLP) technology is developed. The WLP technology is able to package the dice before sawing them to be several chips. U.S. Pat. No. 5,323,051 discloses a WLP technology. However, when the pads on the active surface of the chips are increased and the interval between the pads is become smaller, the WLP technology will cause the signal overlapped or interrupted problems. So, when the chip is become further smaller, the previous package methods are not good enough to use.

In order to solve the problem described above, U.S. Pat. No. 7,196,408 discloses that a wafer is tested and sawed in semiconductor manufacture and put the good dice in another carrier board to do the package process. Therefore, the pads on the dice are able to be separated with good interval. For example a fan out technology is used, it is able to solve the small interval problem but it may cause the signal overlapped or signal interrupt problems.

Nevertheless, in order to let the semiconductor chips have smaller and thinner package structures, before sawing the dices, the wafer will do a thin process first, such as backside lapping process to thin the wafer in 2~20 mils, and the wafer is sawed to be several pieces of chips. After the thin process is done, the dices are put on another carrier board and a molding process is used to encapsulate the chip to be a package structure. Because the chip is very thin, the package structure is also very thin. Therefore, when the package structure is left from the carrier board, the package structure would be out of shape and it would cause the difficulty to do the sawing process.

After sawing the wafer, because the dice are put on another carrier board, the size of the new carrier board is larger than the original carrier board, the ball mounting process is hard for the solder ball to be installed at the exact location and the reliability of the package structure is reduced.

Besides, in the package procedure, the manufacture equipment will generate more pressure in the dice during the ball mounting process. Because of the material of the balls, the resistance between the balls and the solder pads will be become higher than usual and it would affect the function of the chips.

SUMMARY OF THE INVENTION

According to the problems described above, a chip package structures and method is disclosed herein to relocate the chips and then do the package procedures.

Another object of the present invention is to provide a chip package method to relocate the chips are of different dimensions and functions on a carrier substrate.

Besides, one another object of the present invention is to provide a multi-chips package method to let the chips sawed from a 12 inches wafer put a chip-placed frame. Therefore, the 8 inches wafer package equipment is still useful and reduce the cost to buy some 12 inches package equipments.

One other object of the present invention is to provide a chip package method, which is known as good chips, and the package material can be saved and the cost of the manufacture can be decreased.

According to above discussions, the present invention provides a chip packaging method, which includes: providing a carrier substrate having a front surface and a back surface; forming a package structure on the front surface of the carrier substrate, the package structure having a chip-placing hole and a plurality of holes therein to expose portions of the front surface of the carrier substrate; attaching a chip in said chip-placing hole on the carrier substrate and an active surface of the chip is turned upward and a back surface of the chip is attached on the front surface of the carrier substrate by an adhesive layer; forming a patterned first protective layer on the package structure and a plurality of pads on the active surface of the chip to expose the plurality of through holes; forming a metal layer on the patterned first protective layer, the metal layer having a plurality of fan-out patterned metal traces and is filled into the plurality of through holes to form a plurality of conductive posts, first ends of each said plurality of fan-out patterned metal traces is electrically connected to the plurality of pads on the active surface of chip and opposite second ends of each the plurality of fan-out patterned metal traces is extended away from the chip and is electrically connected to the plurality of conductive posts; forming a patterned second protective layer on the metal layer, and the patterned second protective layer having a plurality of openings to expose portions of the second ends of the plurality of fan-out patterned metal traces; forming a plurality of patterned UBM layer on the plurality of openings, and the plurality of patterned UBM layers is electrically connected to plurality of fan-out patterned metal traces; forming a plurality of conductive elements, the plurality of conductive elements is electrically connected to the chip via the plurality of patterned UBM layer and the plurality of fan-out patterned metal traces; and removing a carrier substrate to form a chip package structure.

Another embodiment of the present invention provides a chip package stacked structure, which includes: a package structure having a chip-placing hole and a plurality of through holes therein; a chip fixed in the chip-placing hole and having an active surface and an opposite back surface, the active surface having a plurality of pads thereon and the back surface having an adhesive layer thereon; a patterned first protective layer formed on the package structure and the active surface of chip and the plurality of pads and the plurality of through holes being exposed; a metal layer formed on the patterned first protective layer, the metal layer having a plurality of fan-out patterned metal traces and is filled into the plurality of through holes to form a plurality of conductive posts, first ends of each the plurality of fan-out patterned metal traces is electrically connected to the plurality of pads on the active surface of the chip and opposite second ends of the plurality of fan-out patterned metal traces is extended away from the chip and is electrically connected to the plurality of conductive posts; a patterned second protective layer formed on the metal layer and having a plurality of openings to expose portions of the second ends of the plurality of fan-out patterned metal traces; a plurality of patterned UBM layer formed on the plurality of openings and is electrically connected to the plurality of fan-out patterned metal traces; a plurality of conductive elements formed on the plurality of patterned UBM layer to electrically connect to the chip via said plurality of patterned UBM layers and said plurality of fan-out patterned metal traces; and a chip stacked structure, a plurality of second conductive points on the chip is electrically connected to the plurality of conductive elements.

According to above discussion for package structure, the present invention also provides a multi-chip packaging method, which includes: providing a carrier substrate having a front surface and a back surface; forming a package structure on the front surface of the carrier substrate, the package structure having a plurality of chip-placing holes and a plurality of through holes to expose portions of the front surface of the carrier substrate; attaching a plurality of chips by fixing each the plurality of chips in each the plurality of chip-placing holes, an active surface of each the plurality of chips is turned upward and a back surface of each the plurality of chips is attached on the front surface of the carrier substrate by an adhesive layer; forming a patterned first protective layer on the package structure and the plurality of pads on the active surface of the plurality of chips to expose the plurality of through holes; forming a metal layer on the patterned first protective layer, the metal layer having a plurality of fan-out patterned metal traces and is filled into the plurality of through holes to form a plurality of conductive posts, first ends of the fan-out patterned metal traces is electrically connected to the plurality of pads on the active surface of the plurality of chips and opposite second ends of the fan-out patterned metal traces is extended away from the plurality of chips and is electrically connected to the plurality of conductive posts; forming a patterned second protective layer on the metal layer, and said patterned second protective layer having a plurality of openings to expose portions of said second ends of said plurality of fan-out patterned metal traces; forming a plurality of patterned UBM layer on the plurality of openings, and the plurality of patterned UBM layers is electrically connected to the plurality of fan-out patterned metal traces; forming a plurality of conductive elements, the plurality of conductive elements is electrically connected to the plurality of chips via the plurality of patterned UBM layers and the plurality of fan-out patterned metal traces; forming a multi-chips stacked structure, a structure of a second chip package structure is identical to a first chip package structure having a plurality of conductive elements to electrically connect to the plurality of conductive points of the first chips; and removing the carrier substrate to form a multi-chips package structure.

In addition, the present invention also provides a multi-chips package structure, which includes: a plurality of package structures, each the plurality of package structures having a chip-placing hole and a plurality of through holes therein; a plurality of chips, each plurality of chips fixed in the chip-placing hole and having an active surface and an opposite back surface, the active surface having a plurality of pads thereon, and the back surface having an adhesive layer thereon; a patterned first protective layer formed on portions surface of each the plurality of package structures to expose the plurality of pads and the plurality of through holes; a metal layer formed on the patterned first protective layer, the metal layer having a plurality of fan-out patterned metal traces and is filled into the plurality of through holes to form a plurality of conductive posts, first ends of said plurality of fan-out patterned metal traces is electrically connected to the plurality of pads on the active surface of each plurality of chips, and opposite second ends of the plurality of fan-out patterned metal traces is extended away from each the plurality of chips and electrically connected to the plurality of conductive posts; a patterned second protective layer formed on the metal layer and having a plurality of openings to expose portions of the second ends of the plurality of fan-out patterned metal traces; a plurality of patterned UBM layers formed on the plurality of openings and is electrically connected to the plurality of fan-out patterned metal traces; a plurality of conductive elements formed on the plurality of patterned UBM layer to electrically connect to each the plurality of chips via the plurality of patterned UBM layers and the plurality of fan-out patterned metal traces; and a chip stacked structure, the plurality of conductive points of the first package structure of the plurality of package structures electrically connected to the plurality of conductive elements of a second package structure of the plurality of package structures.

BRIEF DESCRIPTION OF THE DRAWINGS

FIG. 3 shows a plurality of chips that placed on the package structure according to the present invention;

FIG. 4 shows a plurality of patterned first protective layer that formed on the package structure according to the present invention;

FIG. 5 shows a metal layer that formed on the first protective layer and on the plurality of pads, and there is a plurality of conductive posts formed on the carrier substrate according to the present invention;

FIG. 6 shows a plurality of patterned metal layer that formed on the package structure and on the plurality of pads according to the present invention;

FIG. 7 shows a second protective layer that formed on the plurality of patterned metal layer according to the present invention;

FIG. 8 shows a plurality of patterned second protective layer that formed on the patterned metal layer according to the present invention;

FIG. 9 shows a plurality of patterned UBM layer that formed on the surface of fan-out structure of the patterned metal layer according to the present invention;

FIG. 10 shows a plurality of conductive elements that formed on the plurality of patterned UBM layer according to the present invention;

FIG. 11 shows a chip package structure according to the present invention;

FIG. 16 shows a metal layer that formed on the plurality of patterned first protective layer according to the present invention;

FIG. 17 shows a plurality of patterned metal layers that formed on the plurality of patterned first protective layer according to the present invention;

FIG. 18 shows a second protective layer that formed on the plurality of patterned metal layer according to the present invention;

FIG. 19 shows a plurality of patterned second protective layer that formed on the plurality of patterned metal layer according to the present invention;

DESCRIPTION OF THE PREFERRED EMBODIMENT

The present invention provides a packaging method for dies rearrangement to re-dispose dies on another substrate for packaging. Following illustrations describe detailed the process or steps for understanding the present invention. Obviously, the present invention is not limited to the embodiments of a stacked structure; however, the preferred embodiments of the present invention are illustrated as followings. Besides, the present invention may be applied to other embodiments, not limited to ones mentioned.

In modern semiconductor packaging process, a wafer which has been implemented by a front end process is done by a thinning process in thickness about 2 to 20 mil. A sawing process is applied on the wafer to form a plurality of dice units. Then, these dies are transferred from a pick and place to another substrate. It is obvious that there are wider pitches among the dies on the substrate than the ones before sawing. Thus, these rearranged dies have wider pitches for the deposition of bonding pads.

Figure 1:
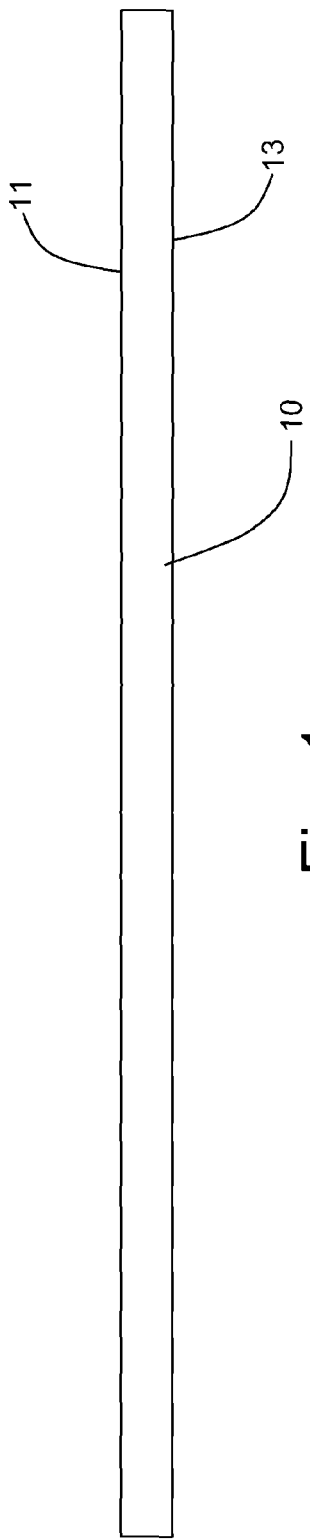
FIG. 1 shows a cross-section view of carrier substrate according to the present invention.
Figure 2:
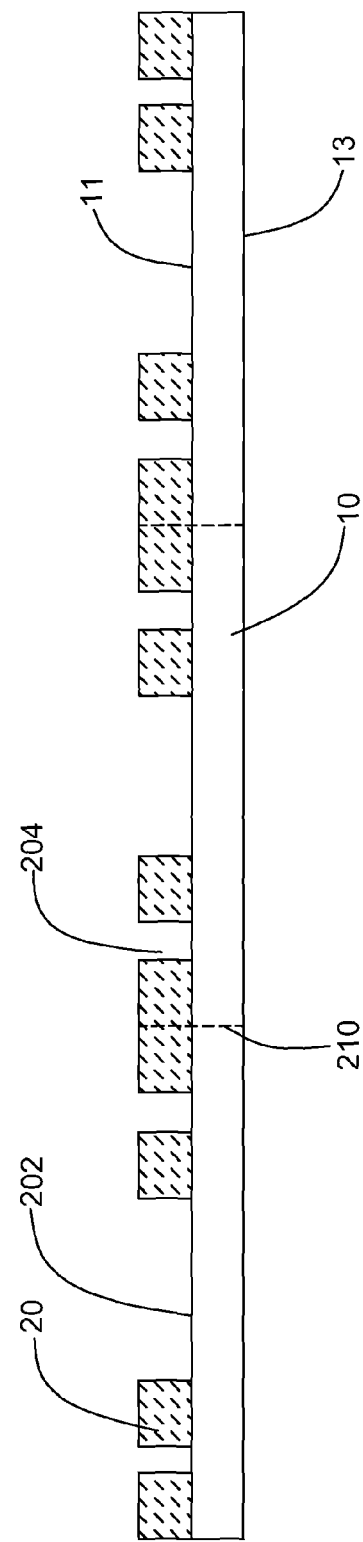
FIG. 2 shows a cross-section view of a package structure formed on the carrier substrate according to the present invention.

Firstly, a wafer (not shown) is provided, and there are a plurality of chips (not shown) placed on the wafer, in which each chips having a plurality of pads (not shown) thereon. Next, FIG. 1 shows providing a carrier substrate 10 having a front surface 11 and a back surface 13, in which the material of carrier substrate 10 can be glass, quartz, ceramic, or the printed circuit board (PCB). Then, FIG. 2 shows a package structure that formed on the carrier substrate. In FIG. 2, a package structure 20 is formed on the carrier substrate 10, and there is a plurality of chip-placing holes 202 and a plurality of through holes 204 formed in the package structure 20 and portions front surface 11 of carrier substrate 10 being exposed. In this embodiment, the forming step of the package structure 20 on the carrier substrate 10 which include a polymer material (not shown) is formed on the front surface 11 of carrier substrate 10, and there is a molding apparatus (not shown) with a plurality of ribs (not shown) that is placed to press down into the polymer material. In this embodiment, the interval between the each plurality of ribs (not shown) of the molding apparatus (not shown) can be identical or different, so that the plurality of through holes 204 can be formed with different aspect ratios when the molding apparatus is pressed down to combine with the polymer material.

Furthermore, the polymer material (not shown) is formed on the carrier substrate 10 by molding process. Identically, a molding apparatus (not shown) with a plurality of ribs (not shown) is pressed down on the polymer material on the carrier substrate 10. Next, an alternative baking process can be performed to cure the polymer material. Thereafter, a polymer material is separated from the molding apparatus with a plurality of ribs to form a package structure with a plurality of chip-placing holes 202 and a plurality of through holes 204, in which portions front surface 11 of the carrier substrate 10 is exposed via the plurality of chip-placing holes 202 and a plurality of through holes 204, and the aspect ratio of the chip-placing hole 202 is larger than the through holes' 204. Therefore, the portion of plurality of chip-placing hole 202 can be chip-placed areas to place the chips therein (not shown), and the portion of plurality of though holes 204 is used for forming a plurality of conductive posts (not shown) therein for the chip stacked during the follow-up process.

Then, a plurality of sawing lines 210 is formed on the surface of the package structure 20 by using sawing knife (not shown) as shown in FIG. 2. In this embodiment, the depth of each of the sawing lines 210 is about 0.5~1 mils. The width of each of the sawing lines 210 is about 5~25 mm. In a preferred embodiment, the sawing lines 210 are interlaced to each other and used to be the reference line when sawing the chips.

Next, FIG. 3 shows a plurality of chips that placed on the package structure on the carrier substrate. First, the wafer (not shown) is cut to produce a plurality of chips 30, and an active surface of each plurality of chips 30 is turned upward. Next, a pick and placing apparatus (not shown) is used to pick up each chip 30 and put them on the portion of exposed front surface 11 of the carrier substrate 10. Because there is a plurality of pads 302 disposed on the active surface of each chip 30 and the pick and placing apparatus (not shown) can recognize the location of the pads 302 on the active surface of the each chip 30. When the pick and placing apparatus is going to put the each chip 30 on the front surface 11 of carrier substrate 10, the chip 30 is able to exactly put on the front surface 11 of the carrier substrate 10 in accordance with the reference point (not shown) of the carrier substrate 10. Therefore, when the chips 30 are relocated on the chip-placed area (the front surface 11 of carrier substrate 10 is exposed by the plurality of chip-placing holes 202, the chips 30 are able to put on the current location of the chip-placing hole 202. Besides, the relative location of the chip-placing hole 202 is used to enhance the accuracy of the relation of the chips 30 by using the chip-placing hole 202 as the chip-placed area to relocate those chips 30.

Furthermore, in this embodiment, the back surface of each chips further include an adhesive layer 40 and the adhesive layer 40 is used to stick the back surface of the chips 30 on the front surface (the chip-placed area) of the carrier substrate 10. The material of the adhesive layer 40 is a sticky material with elasticity and is selected form the group consisting of: silicone rubber, silicone resin, elasticity PU, multi-holes PU, acrylic rubber and chip cutting glue.

Next, FIG. 4 is a view showing that a plurality of patterned first protective layer is formed on the package structure. As shown in FIG. 4, the forming steps include: a first protective layer (not shown) is formed on the package structure 20 and each chip 30; then, a semiconductor process, such as lithography and etching, is used to form a first patterned photoresist layer (not shown) on the first protective layer; next, an etching process is used to remove a portion of first protective layer to form a patterned first protective layer 502 on the package structure 20 and the plurality of pads 302 and the plurality of through holes 204 are exposed. In this embodiment, the material of first protective layer can be paste or B-stage material.

After the location of the pads 302 for each chip 30 is confirmed, the conventional redistribution layer (RDL) process is used on the pads 302 exposed on each chip 30 to form a plurality of fan-out and patterned metal traces 602. One end of each of the patterned metal traces 602 is electrically connected to the pads 30 and opposite ends of portions of the patterned metal traces 602 are formed on the patterned first protective layer 502 by a fan-out format. The steps for forming the patterned metal traces 602 include: forming a metal layer 60 on the patterned first protective layer 502 and the metal layer 60 is filled into the plurality of through holes 204 to form a plurality of conductive posts 610 as shown in FIG. 5; forming a patterned photoresist layer (not shown) on the metal layer 60 by using a semiconductor process; etching a portion of the metal layer 60 to expose portions of patterned first protect first protective layer 502 to form the patterned metal traces 602, in which one end of portion of patterned metal traces 602 is electrically connected to the pads 302 on the active surface of the chips 30 and opposite ends of the patterned metal traces 602 by fan-out format as shown in FIG. 6. The opposite ends of the plurality of fan-out patterned metal traces 602 is extended away from the chip 30 and is electrically connected to the plurality of conductive posts 610.

Next, a patterned second protective layer 70 is formed on the fan-out and patterned metal traces 602 and used to cover the patterned metal traces 602 by using a semiconductor manufacturing process, as shown in FIG. 7. Then, the same semiconductor manufacturing process is used to form a plurality of openings 704 on the second protective layer 70 and on the surface of patterned metal traces 602 which is extended outward the active surface of each chip 30. The steps of forming the openings 704 on the second protective layer 50 include: forming a patterned photoresist layer (not shown) above the second protective layer 70 by a semiconductor manufacturing process; then etching to remove a portion of the second protective layer 70 to form a patterned second protective layer 702 and the plurality of openings 704 and used to expose the surface of one ends of fan-out and patterned metal trace 602 as shown in FIG. 8. In this embodiment, the material of second protective layer 70 also can be paste or B-stage material or polyimide. In another embodiment, each plurality of openings 704 is formed on each plurality of conductive posts 610.

Now, in FIG. 9, it is a view showing that a plurality of patterned UBM layers are formed on the surface of the other end of the exposed, fan-out and patterned metal trace. As shown in FIG. 9, on the surface of the other end of the exposed, fan-out and patterned metal trace 602, a UBM layer (not shown) is formed by the way of sputtering. Next, a patterned photoresist layer (not shown) is formed on the UBM layer by a semiconductor manufacture. Then, a portion of the UBM layer is removed by an etching method to form a plurality of patterned UBM layers 802 on the surface of the exposed each of the fan-out patterned metal traces 602. The patterned UBM layers 802 are electrically connected to the patterned metal traces 602, in the present embodiment, the material of the UBM layer 80 is Ti/Ni or Ti/W.

Eventually, a plurality of conductive elements 90 are formed on each patterned UBM layers 802 and used to be the connective points for the chips 30 to connect the external components. The conductive elements 90 can be some metal bumps or solder balls and are electrically connected by the patterned UBM layers 802 and the patterned metal traces 602. Therefore, the package structure is able to perform the final cutting. In the present embodiment, the cutting unit can be a plurality of chips 30 as shown in FIG. 11.

Figure 12:
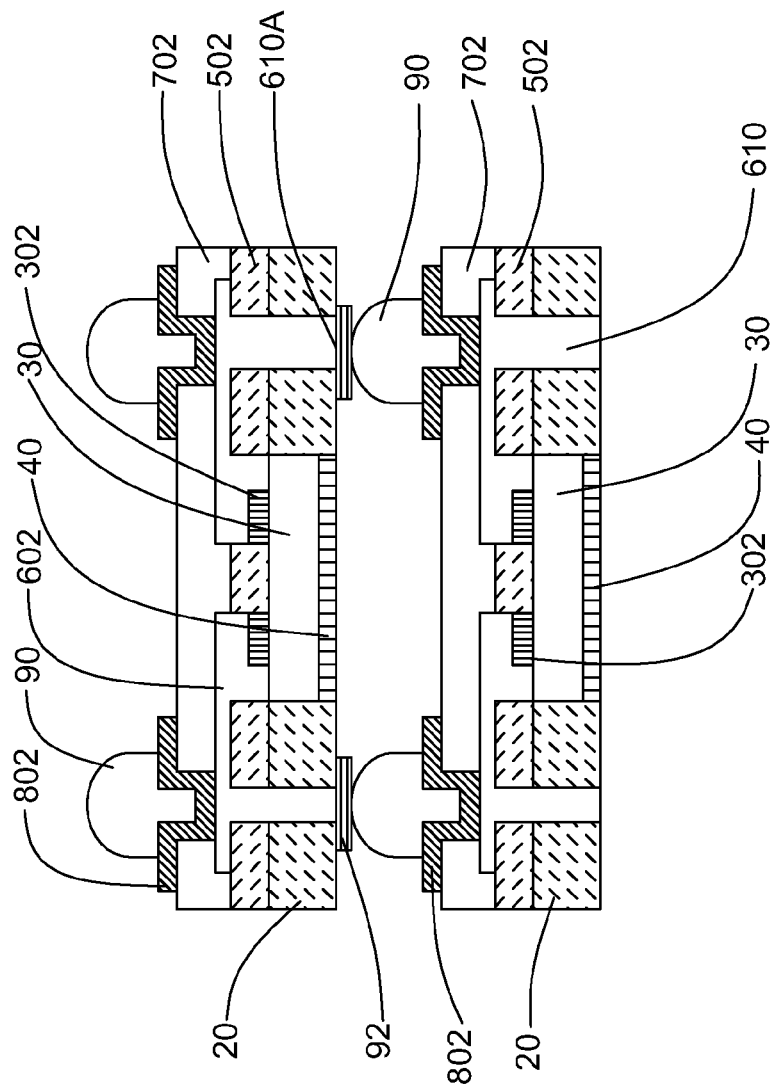
FIG. 12 show a chip stacked package structure according to the present invention.

Next, FIG. 12 is a views showing that a chip-stacked package structure. In this embodiment, the conductive points 610A of the conductive posts 610 of the upper packaged chip 30 is stacked on the another conductive elements 90 of the bottom packaged chip 30 to form a stacked structure. In addition, there is a connecting pad 92 further disposed between the conductive point 610A of upper packaged chip 30 and the conductive elements 90. In another embodiment, the connecting pad 92 also can be formed by another electroplating process.

Figure 13:
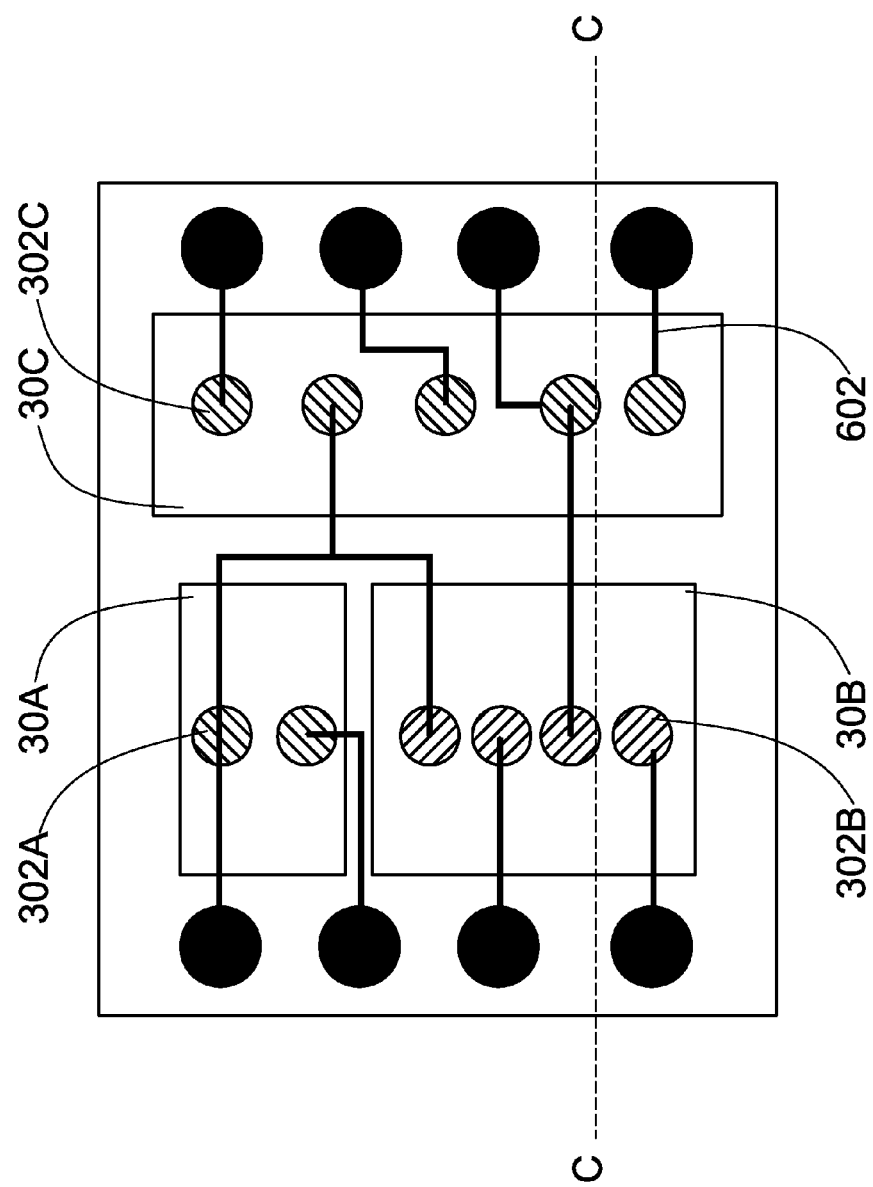
FIG. 13 shows a vertical view of SIP (system-in-package) according to the present invention.

Then, FIG. 13 is a vertical view showing that a SIP (System-In-Package) with different chip size. In this embodiment, those chips can be a microprocessor means 30A, memory means 30B, or memory controller means 30C, in which each chip 30A, 30B, and 30C having a plurality of pads 302A, 302B, and 302C on the active surface of each chip 30A, 30B, and 30C. The adjacent chips 30A, 30B, or 30C is electrically connected to each other that can be in series connection or in parallel connection by the plurality of patterned metal traces 602 is formed on the pads 302A, 302B, and 302C of each chip 30A, 30B, and 30C.

Figure 14:
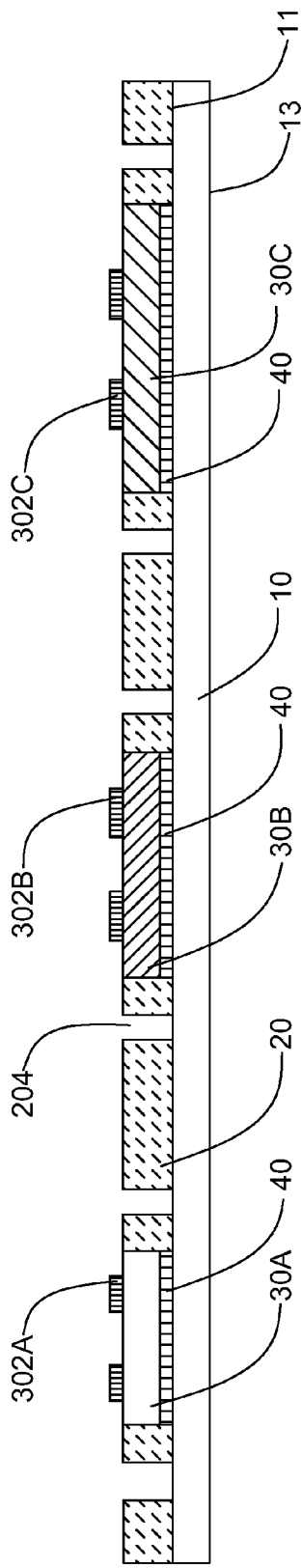
FIG. 14 shows a plurality of chips with different size that placed on the package structure on the carrier substrate according to the present invention.

FIG. 14 through FIG. 21 are views showing that the flow process for forming the SIP structure. As shown in FIG. 14, a package structure 20 with a plurality of chip-placing holes and a plurality of through holes 204 with different aspect ratios therein is formed on the carrier substrate 10. In this embodiment, the forming method for the package structure 20 with a plurality of chip-placing holes and a plurality of through holes is identical to the above discussion in accordance with the present invention. Therefore, the detail description is omitted herein. It is noted that the dimension of the plurality of chip-placing holes with different aspect ratios is corresponding to the dimension of the chips 30A, 30B, and 30C which disposed on the carrier substrate 10. Next, the different wafers with different function are cut to obtain the plurality of chips 30A, 30B, and 30C with different size. Then, a pick and placing apparatus (not shown) is used to pick up each different chip 30A, 30B, and 30C and put them on the exposed front surface 11 of carrier substrate 10. Therefore, when each chip 30A, 30B, and 30C are relocated the exposed front surface 11 of carrier substrate 10, each chip 30A, 30B and 30C are able to exactly put on the front surface 11 of the carrier substrate 10 in accordance with the reference point (not shown) of the carrier substrate 10. Besides, the relative location of the chip-placing holes is used to enhance the accuracy of the relation of the chips 30 by using the chip-placing holes to relocate those chips 30.

In addition, the back surface of each chip 30A, 30B, and 30C includes an adhesive layer 40 that is used to fix the back surface of each chip 30A, 30B, and 30C with different size can fixedly dispose on the front surface 11 of the carrier substrate 10. In this embodiment, the material of the adhesive layer 40 is a sticky material with elasticity and is selected form the group consisting of: silicone rubber, silicone resin, elasticity PU, multi-holes PU, acrylic rubber and chip cutting glue.

Figure 15:
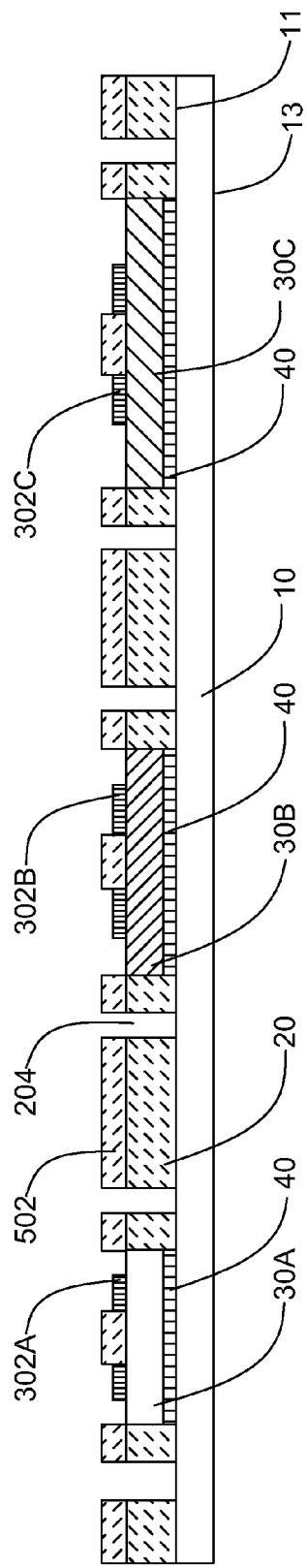
FIG. 15 shows a plurality of patterned first patterned protective layers that formed on the package structure according to the present invention.

Then, FIG. 15 is a view showing that a plurality of patterned first protective layer is formed on the package structure. The forming steps include: a first protective layer (not shown) is formed on the package structure 20 and each chip 30A, 30B, and 30C are of different dimensions and functions a patterned photoresist layer (not shown) is formed on the first protective layer by using a semiconductor process; then, an etching process is used to remove the portion of first protective layer to form a patterned first protective layer 502 on the package structure 20 and the pads 302A, 302B, and 302C on the active surface of each chip 30A, 30B, and 30C, and the plurality of through holes 204 are exposed. In this embodiment, the material of first protective layer can be paste, B-stage material, or polyimide.

After the location of the pads 302A, 302B, and 302C for each chip 30A, 30B, and 30C are confirmed respectively, the conventional redistribution layer (RDL) process is used on the pads 302A, 302B, and 302C exposed on each chip 30 to form a plurality of fan-out patterned metal traces 602. One ends of each the patterned metal traces 602 is electrically connected to the pads 302A, 302B, and 302C, and opposite ends of a portion of the patterned metal traces 602 are formed on the patterned first protective layer 502 by a fan-out format. Furthermore, the metal layer 60 is filled into the plurality of through holes 204 to form a plurality of conductive posts 610. The steps for forming the patterned metal traces 602 include: forming a metal layer 60 on the patterned first protective layer 502 and the metal layer 60 is filled into the through holes 204 to form the conductive posts 610 as shown in FIG. 16; forming a patterned photoresist layer (not shown) on the metal layer 60 by using a semiconductor process; etching a portion of the metal layer 60 to form the patterned metal traces 602, in which one end of portion of patterned metal traces 602 is electrically connected to the pads 302A, 302B, and 302C on the active surface of the chips 30A, 30B, and 30C and opposite ends of portions of the patterned metal traces 602 by fan-out format as shown in FIG. 17.

Next, a patterned second protective layer 70 is formed on the fan-out patterned metal traces 602 and used to cover the active surface of each chip 30A, 30B, and 30C and the fan-out patterned metal traces 60 by using a semiconductor manufacturing process, as shown in FIG. 18. Then, the same semiconductor manufacturing process is used to form a plurality of openings 704 on the second protective layer 70 and the externally extended surface of the active surface of each chip 30A, 30B, and 30C, which is opposite to the patterned metal traces 60. The steps of forming the openings 704 on the second protective layer 50 include: forming a patterned photoresist layer (not shown) above the second protective layer 70 by using a semiconductor manufacturing process; then etching to remove a portion of the second protective layer 70 to form a patterned second protective layer 702 and the plurality of openings 704, and the plurality of opening 704 is used to expose the surface of one ends of fan-out patterned metal trace 602 as shown in FIG. 19. In this embodiment, the material of second protective layer 70 also can be paste, B-stage material, or polyimide. In another embodiment, each plurality of opening 704 also can be formed on each plurality of conductive posts 610.

Figure 20:
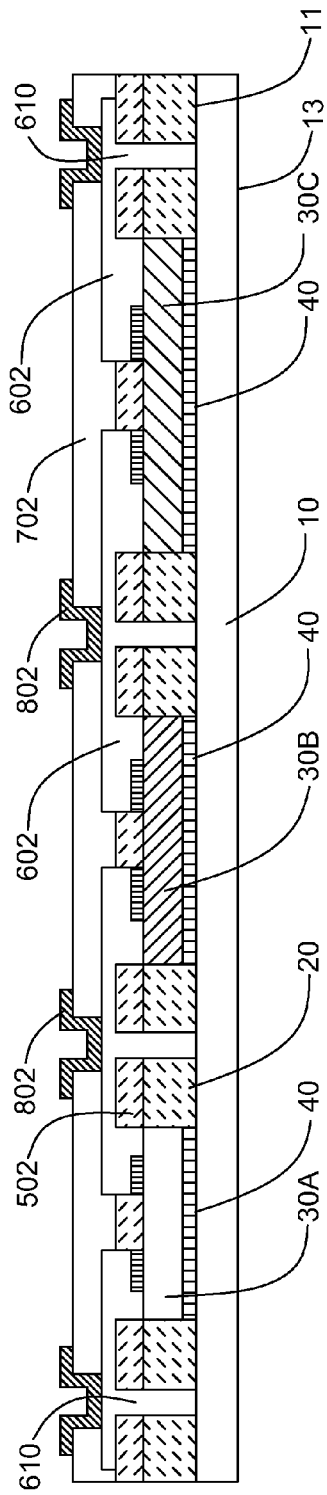
FIG. 20 shows a plurality of patterned UBM layer that formed on the surface of fan-out structure of each plurality of patterned metal layer according to the present invention.

Now, in FIG. 20, it is a view showing that a plurality of patterned UBM layers is formed on the surface of the opposite ends of the exposed fan-out patterned metal trace. As shown in FIG. 20, a UBM layer (not shown) is formed by the way of sputtering on the surface of the opposite ends of the exposed fan-out patterned metal trace 602 on each plurality of openings 704. Next, a patterned photoresist layer (not shown) is formed on the UBM layer by using a semiconductor manufacturing process. Then, a portion of the UBM layer is removed by an etching method to form a plurality of patterned UBM layers 802 on the surface of the exposed each of the fan-out patterned metal traces 602. The patterned UBM layers 802 are electrically connected to the patterned metal traces 602, and in the present embodiment, the material of the UBM layer 80 is Ti/Ni or Ti/W.

Figure 21:
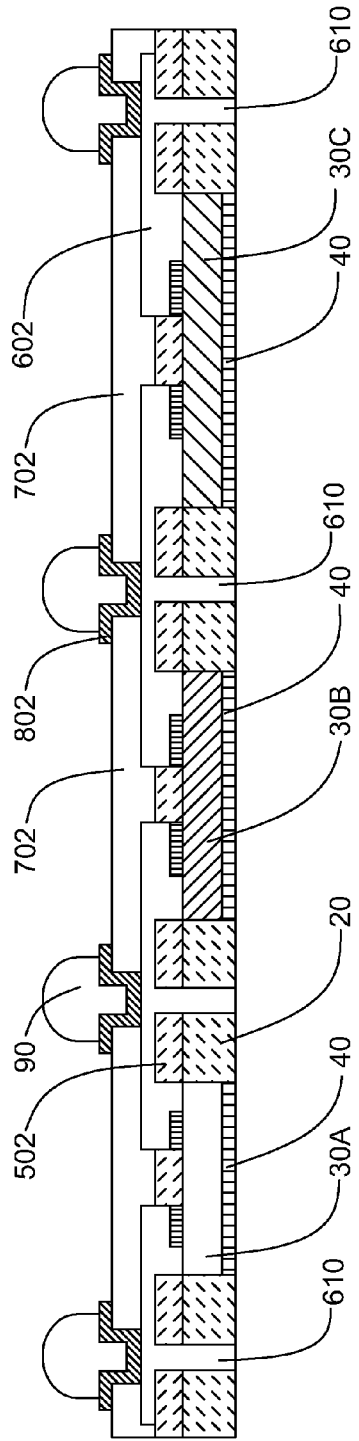
FIG. 21 shows a plurality of conductive elements that formed on the plurality of patterned UBM layer to form a multi-chips package structure according to the present invention.

Eventually, a plurality of conductive elements 90 are formed on each patterned UBM layers 802 and used to be the connective points for the chips 30A, 30B, and 30C to connect the external components. The conductive elements 90 can be some metal bumps or solder balls and are electrically connected by the patterned UBM layers 802 and the patterned metal traces 602. Therefore, the package structure is able to perform the final cutting. In the present embodiment, the cutting unit can be a multi-chip package structure as shown in FIG. 21.

It should be noted that the fan-out structure of the metal trace 60 is not limited by using a conventional RDL and as long as the semiconductor manufacture method can form a fan-out structure can be one of the embodiments in the present invention. Basically, the semiconductor manufacture method to form a fan-out structure is a conventional prior art, the detail description is omitted herein.

Although specific embodiments have been illustrated and described, it will be appreciated by those skilled in the art that various modifications may be made without departing from the scope of the present invention, which is intended to be limited solely by the appended claims

What is claimed is:

1. A chip packaging method, comprising:
   providing a carrier substrate having a front surface and a back surface;
   forming a package structure on said front surface of said carrier substrate, said package structure having a chip-placing hole and a plurality of through holes therein to expose portions of said front surface of said carrier substrate;
   attaching a chip in said chip-placing hole on said carrier substrate and an active surface of said chip is turned upward and a back surface of said chip is attached on said front surface of said carrier substrate by an adhesive layer;
   forming a patterned first protective layer on said package structure and a plurality of pads on said active surface of said chip to expose said plurality of through holes;
   forming a metal layer on said patterned first protective layer, said metal layer having a plurality of fan-out patterned metal traces and is filling into said plurality of through holes to form a plurality of conductive posts, first ends of each said plurality of fan-out patterned metal traces is electrically connected to said plurality of pads on said active surface of said chip and opposite second ends of each said plurality of fan-out patterned metal traces is extended away from said chip and is electrically connected to said plurality of conductive posts;
   forming a patterned second protective layer on said metal layer, and said patterned second protective layer having a plurality of openings to expose portions of said second ends of said plurality of fan-out patterned metal traces;
   forming a plurality of patterned UBM layers on said plurality of openings, and said plurality of patterned UBM layers is electrically connected to said plurality of fan-out patterned metal traces;
   forming a plurality of conductive elements, said plurality of conductive elements is electrically connected to said chip via said plurality of patterned UBM layers and said plurality of fan-out patterned metal traces; and
   removing said carrier substrate to form a chip package structure.

2. The method according to claim 1, wherein the step of forming said package structure having said chip-placing hole and said plurality of through holes comprising:
   forming a polymer material on said front surface of said carrier substrate;
   placing a molding apparatus on said polymer material, said molding apparatus having a plurality of ribs corresponding to said chip-placing hole and said plurality of through holes and is pressed down into said polymer material; and separating said molding apparatus to form said package structure having said chip-placing hole and said plurality of through holes therein.

3. A multi-chip packaging method, comprising:

providing a carrier substrate having a front surface and a back surface;

forming a package structure on said front surface of said carrier substrate, said package structure having a plurality of chip-placing holes and a plurality of through holes to expose portions of said front surface of said carrier substrate;

attaching a plurality of chips on said carrier substrate by fixing each said plurality of chips in each said plurality of chip-placing holes, an active surface of each said plurality of chips is turned upward and a back surface of each said plurality of chips is attached on said front surface of said carrier substrate by an adhesive layer;

forming a patterned first protective layer on said package structure and a plurality of pads on said active surface of said plurality of chips to expose said plurality of through holes;

forming a metal layer on said patterned first protective layer, said metal layer having a plurality of fan-out patterned metal traces and is filled into said plurality of through holes to form a plurality of conductive posts, first ends of said fan-out patterned metal traces is electrically connected to said plurality of pads on said active surface of said plurality of chips and opposite second ends of said fan-out patterned metal traces is extended away from said plurality of chips and is electrically connected to said plurality of conductive posts;

forming a patterned second protective layer on said metal layer, and said patterned second protective layer having a plurality of openings to expose portions of said second ends of said plurality of fan-out patterned metal traces;

forming a plurality of patterned UBM layers on said plurality of openings, and said plurality of patterned UBM layers is electrically connected to said plurality of fan-out patterned metal traces; and forming a plurality of conductive elements, said plurality of conductive elements is electrically connected to said plurality of chips via said plurality of patterned UBM layers and sad plurality of fan-out patterned metal traces.

4. The packing method according to claim 3, wherein said plurality of chips are of different dimensions and functions.

5. The package method according to claim 4, wherein said plurality of chips is selected from the group consisted of: microprocessor means, memory means, and memory controller means.

6. The packaging method according to claim 3, wherein said plurality of chips are of identical dimension and function.

* * * * *